United States Patent [19]

Cushing

[11] 4,164,688

[45] Aug. 14, 1979

[54] DEFLECTION AMPLIFIER

[75] Inventor: Brian M. Cushing, Alton, England

[73] Assignee: The Solartron Electronic Group Limited, Farnborough, England

[21] Appl. No.: 835,118

[22] Filed: Sep. 21, 1977

[30] Foreign Application Priority Data

Oct. 4, 1976 [GB] United Kingdom ............... 41023/76

[51] Int. Cl.² ......................... H01J 29/70; H01J 29/72
[52] U.S. Cl. ..................................... 315/389; 315/397
[58] Field of Search ............... 315/387, 389, 396, 397, 315/408

[56] References Cited

U.S. PATENT DOCUMENTS

| | | | |
|---|---|---|---|
| 3,628,083 | 12/1971 | Holmes | 315/387 X |
| 3,934,173 | 1/1976 | Korver | 315/408 |
| 3,983,452 | 9/1976 | Bazin | 315/397 |

Primary Examiner—Theodore M. Blum

Attorney, Agent, or Firm—William R. Sherman; Martin M. Novack

[57] ABSTRACT

A deflection amplifier for driving a magnetic-deflection cathode-ray tube in a digital plotter has two switching circuits coupled to low- and high-voltage supplies respectively. An error amplifier compares the actual deflection-coil current, as indicated by the voltage developed across a resistor in series with the coil, with the command input voltage indicating the required current. As long as the difference between required and actual currents is less than a predetermined threshold value, only the low-voltage switching circuit operates, thereby limiting power dissipation. However, if the current difference exceeds the threshold value for at least 2µs, the high-voltage switching circuit commences operation to supplement the drive provided by the low-voltage circuit. The high-voltage circuit is limited by logic circuitry to periods of operation 20µs long with a 5µs quiescent period between each. The low- and high-voltage supplies are bipolar, and corresponding bipolar threshold values are provided.

4 Claims, 3 Drawing Figures

DEFLECTION AMPLIFIER

The present invention relates to a deflection amplifier for driving a cathode ray tube deflection coil in dependence upon a deflection command waveform. The invention concerns a problem which arises in such applications as digital plotters where it is desirable not only to be able to perform programmed deflections for drawing symbols and graphic features at a speed suitable for producing visible traces but to be able to deflect rapidly to different regions of the screen at which symbols have to be displayed. Deflections in two co-ordinates are obtained by the use of two deflection amplifiers driving corresponding coils. If such deflections are not performed rapidly, there is waste of the time of the data processor controlling the display and slowing down of the refresh rate of the display.

As against this, the type of commercially available cathode ray tube which is suitable for a digital plotter has magnetic deflection and the power of the deflection amplifier has to be sufficient to achieve the required rate of deflection, notwithstanding the high inductance of the driven load. If a deflection amplifier is designed for the required maximum current (say 8A for a full screen deflection) and the voltage necessary to obtain the required maximum rate of deflection (say 60v), the potential power dissipation is excessive.

With a view to overcoming this problem, the present invention provides a deflection amplifier including a current control circuit arranged to operate between first voltage supply rails to supply current to and draw current from a deflection coil in dependence upon a command waveform, a feedback circuit for providing an error signal representing the difference between the commanded and actual currents, and a current switching circuit arranged to operate between second voltage supply rails having, in operation, a higher potential difference therebetween than the first rails, and to supply current to and draw current from the deflection coil, depending upon the sign of the error signal, when the magnitude of the error signal exceeds a threshold value.

The second rails can, for example, be at ±60v while the first rails are only at ±15v. Normally the current switching circuit is quiescent and the power dissipation is restricted to the current control circuit. In order to exercise adequate control over the high power dissipation arising with use of the switching circuit, it can be arranged that, whenever this circuit is called into operation, the length of time for which it can operate is limited (to 20 $\mu$s in the example given below) and a quiescent time (5 $\mu$s in the example) is imposed before there can be any re-operation. This limits average power to 4/5 peak power for the worst possible case. It may also be arranged to inhibit operation of the switching circuit unless the magnitude of the error signal exceeds the threshold value for a certain minimum time, e.g. 2 $\mu$s in order to prevent needless switching on of this circuit.

The invention will be described in more detail, by way of example, with reference to the accompanying drawings in which.

Figure 1:
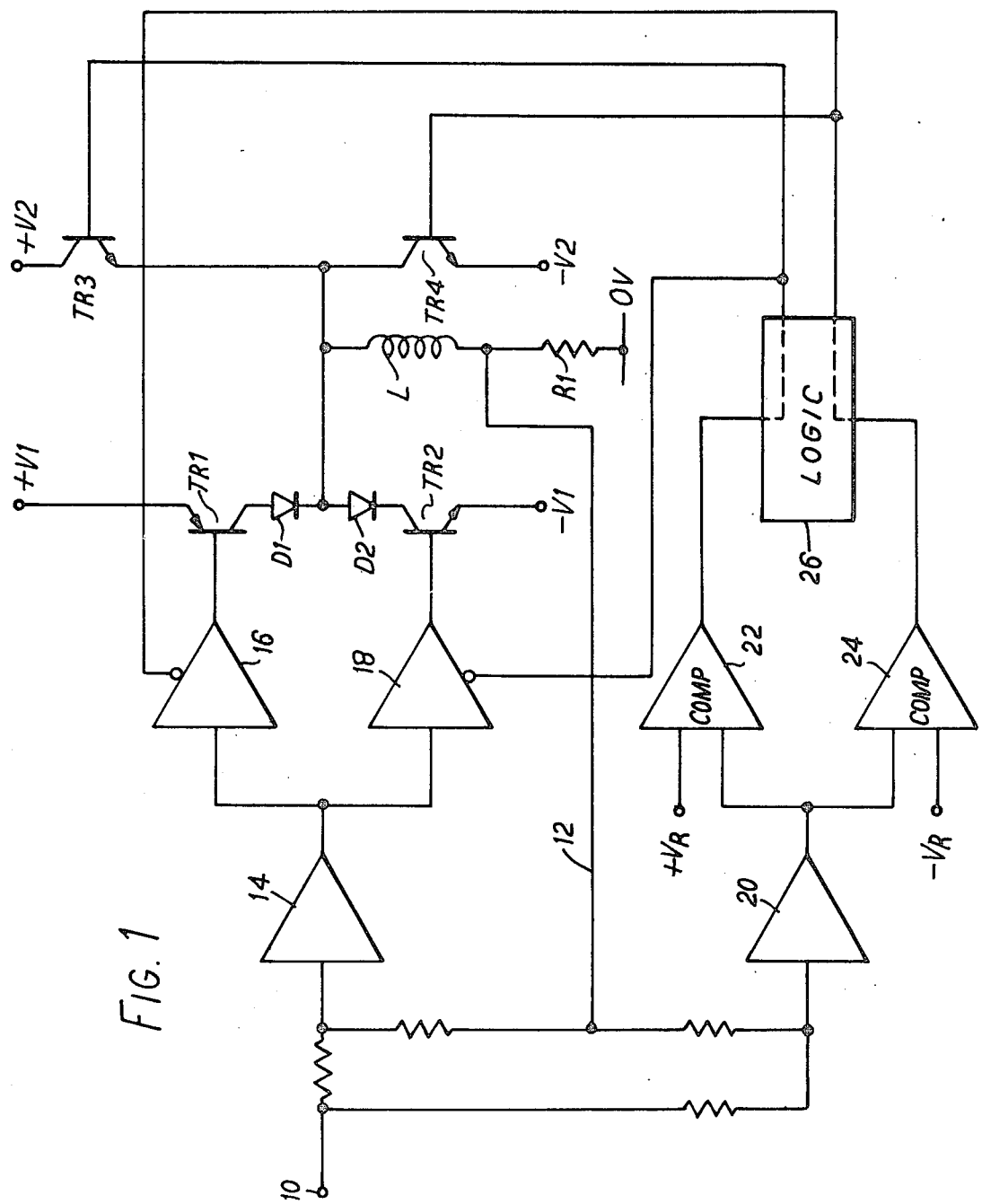
FIG. 1 is a simplified circuit diagram of an embodiment of the invention

FIG. 1 shows an input terminal 10 to which a deflection command waveform is applied. This terminal and a negative feedback connection 12 are connected to an operational amplifier 14 which in turn drives separate amplifiers 16 and 18 for positive and negative excursions. These amplifiers separately control transistors TR1 and TR2 forming a current control circuit. Each of TR1 and TR2 may consist of a plurality of transistors connected in parallel to get the required current capability. The amplifiers 16 and 18 turn on TR1 and TR2 to the extent required to respectively feed current from +V1 to a deflection coil L and draw current to −V1 from the coil L. The coil is connected to ground through a very small resistor, say 0.05 ohm, across which the feedback signal is developed. When the command waveform is changing rapidly TR1 or TR2 will be unable to supply sufficient current to keep up with the required change and it is arranged then to bring into operation a current switching circuit comprising transistors TR3 and TR4 operating between substantially higher voltages +V2 and −V2.

To this end a further comparison is made between the command waveform and the feedback signal by an amplifier 20 which provides an error signal at its output. The error signal is compared with thresholds $+V_R$ and $-V_R$ by comparators 22 and 24. These thresholds may be so selected as to be exceeded when the actual coil current differs from the commanded current by more than 0.7A. In principle, when $+V_R$ is exceeded, the comparator 22 turns on TR3 and inhibits amplifier 18 and, when $-V_R$ is exceeded (negatively), the comparator 24 turns on TR4 and inhibits amplifier 16. These actions are, however, subject to certain logical operations performed by logic 26 which will also be described below.

When TR3 conducts, diode D1 protects TR1 against an inverse voltage; D2 similarly protects TR2 when TR4 conducts.

Figure 2:
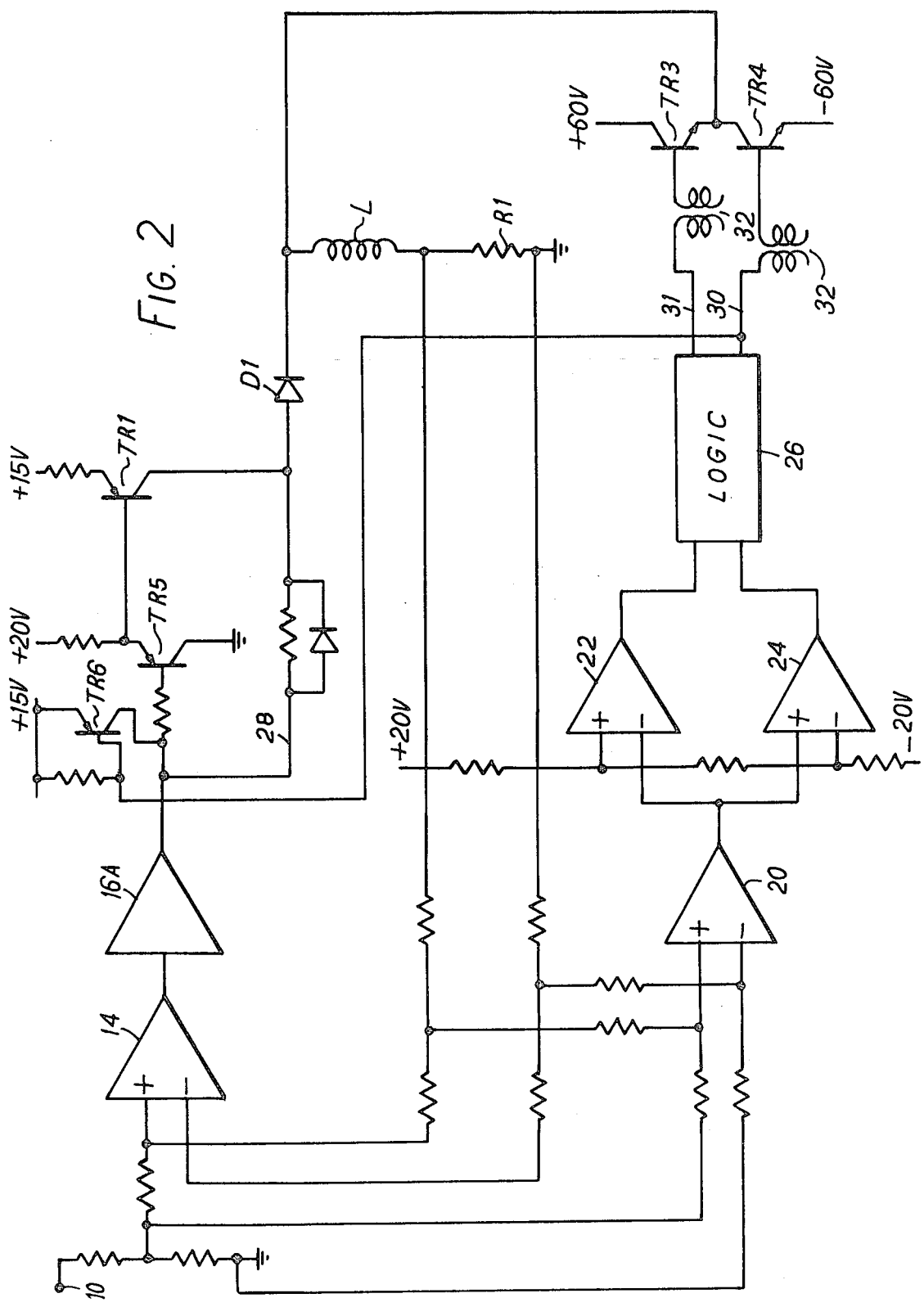
FIG. 2 shows some features of FIG. 1 in more detail.

FIG. 2 omits because of the similarity of the circuitry, the amplifier 18 and TR2. The connections to amplifiers 14 and 20 are shown in more detail and it will be noted that, in view of the heavy currents involved, feedback paths are two-wire to avoid possible common mode signals. The amplifier 16 comprises an amplifier 16A driving TR1 through an emitter follower TR5. Various applications of feedback will typically be employed in the design of the amplifier 16 and an internal feedback connection 28 is included around TR5.

It will be apparent that the existence of this feedback path would allow TR4 to draw heavy base current from TR5 and saturate TR5 and TR1. To prevent this, when the comparator 24 turns on TR4 via line 30, it also turns on a transistor TR6 which clamps the input of TR5 to a positive level. Corresponding provisions are made in respect of amplifier 18.

TR3 and TR4 require a heavy base drive, perhaps 2A and 10:1 step up transformers 32 are included in the connections to the base electrodes.

Figure 3:
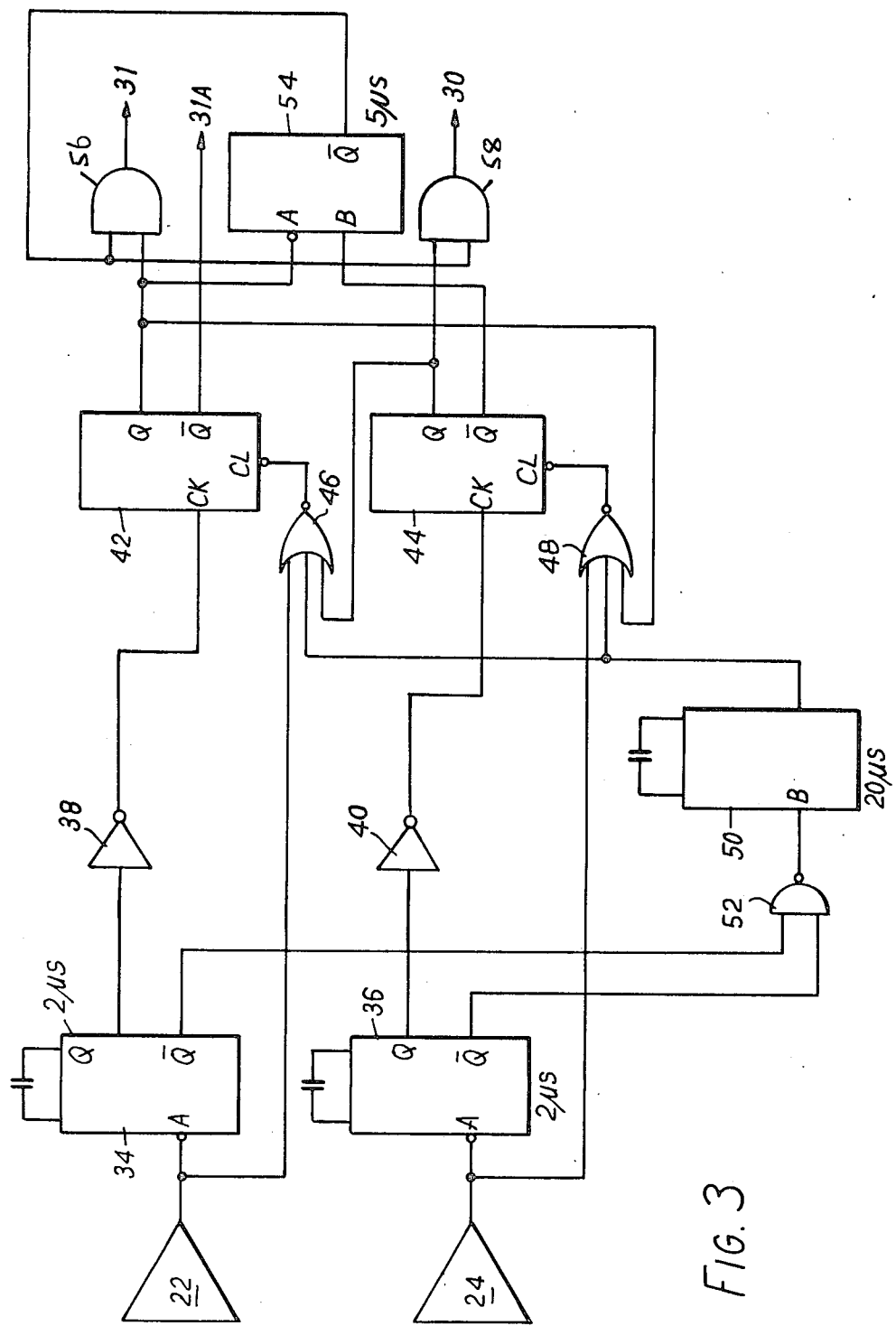
FIG. 3 is a diagram of the logic employed in FIG. 1.

The logic 26 is shown in FIG. 3. Each comparator 22 and 24 triggers from a high to a low output when its respective threshold is exceeded. Corresponding monostable multivibrators 34 and 36 each provide a respective high pulse of 2 $\mu$s duration on the respective Q output and a respective low pulse on the respective Q̄ output. The high pulses are inverted by inverters 38 and 40 and applied to clock inputs of bistable circuits 42 and 44 which trigger on a rising edge. When a comparator output goes low therefore, the corresponding circuit 42 or 44 will be set, after a 2 μs delay, provided that its clear input CL is high. This requires a corresponding NOR gate 46 or 48 to have all three inputs low which requires that (a) the comparator output shall persist low, (b) a monostable multivibrator 50 shall remain set, and (c) the other circuit 44 or 42 shall not be set.

The multivibrator 50 is set when either of the multivibrators 34 and 36 is set, via a NAND gate 52 and resets after a 20 μs delay. It follows that a bistable circuit 42 or 44 cannot be set unless the corresponding comparator output has been low for 2 μs and the bistable circuit will be reset as soon as the comparator output reverts to high or in any event after the elapse of 20 μs. The Q outputs of the circuits 42 and 44 are applied to AND gates 56 and 58 whose outputs correspond to the lines labelled 31 and 30 in FIG. 2. The Q output of 42 (line 31A) is used for turning on the transistor (not shown) corresponding to TR6 (FIG. 2) but associated with amplifier 18.

A further monostable multivibrator 54 is set when either the circuit 42 or 44 resets (54 sets when Q of 42 goes low or when Q of 44 goes high). The multivibrator 54 establishes a 5 μs time during which the signals for turning on TR3 and TR4 are inhibited.

What is claimed is:

1. A deflection amplifier responsive to a command waveform and including a negative-feedback current control circuit operating between first voltage supply to supply current to and draw current from a deflection coil in dependence upon the command waveform, a feedback circuit for providing an error signal representing the difference between the commanded and actual currents, and a current switching circuit operating between second voltage supply rails having a higher potential difference therebetween than the first rails, and supplying current to and drawing current from the deflection coil, depending upon the sign of the error signal, when the magnitude of the error signal exceeds a threshold value.

2. A deflection amplifier according to claim 1, comprising means for preventing the current switching circuit operating until the magnitude of the error signal has exceeded the threshold value for a predetermined interval of time.

3. A deflection amplifier according to claim 1, comprising means for terminating operation of the current switching circuit at the end of a predetermined interval of time, when operation has not been previously terminated by reduction in the magnitude of the error signal.

4. A deflection amplifier according to claim 1, comprising means for inhibiting operation of the current switching circuit for a predetermined interval of time following termination of the operation thereof.

* * * * *